(12) United States Patent
Usami et al.

(10) Patent No.: US 6,239,483 B1
(45) Date of Patent: May 29, 2001

(54) SEMICONDUCTOR DEVICE

(75) Inventors: Mitsuo Usami, Akishima; Kunihiro Tsubosaki, Hino; Masaru Miyazaki, Ome, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/557,218

(22) Filed: Apr. 25, 2000

Related U.S. Application Data

(62) Continuation of application No. 09/417,466, filed on Oct. 12, 1999, now Pat. No. 6,140,697, which is a continuation of application No. 08/930,083, filed as application No. PCT/JP96/01264 on May 14, 1996, now Pat. No. 5,986,341.

(30) Foreign Application Priority Data

May 18, 1995 (JP) ................................................ 7-120237

(51) Int. Cl.[7] .................................................. H01L 23/02
(52) U.S. Cl. .......................... 257/679; 257/723; 257/724
(58) Field of Search ...................... 257/679, 723, 257/724, 678, 702

(56) References Cited

U.S. PATENT DOCUMENTS

| | | | |
|---|---|---|---|
| 5,598,032 | * | 1/1997 | Fidalgo . |
| 5,909,050 | * | 1/1999 | Furey et al. . |
| 5,969,951 | * | 10/1999 | Fisher et al. . |
| 5,986,341 | * | 11/1999 | Usamie et al. . |
| 5,996,897 | * | 12/1999 | Prancz . |

* cited by examiner

Primary Examiner—Sheila V. Clark
(74) Attorney, Agent, or Firm—Antonelli, Terry, Stout & Kraus, LLP

(57) ABSTRACT

Condenser (114), coil (115) and thin-thickness integrated circuit (312) are placed between the upper cover sheet (117) and the lower cover sheet (118), and adhesive (119) is filled into the space among them, whereby a card is fabricated. Because condenser (114), coil (115) and thin-thickness integrated circuit (312) are extremely thin, the resulting semiconductor device is strong to bending and highly reliable at a low cost.

18 Claims, 18 Drawing Sheets

SEMICONDUCTOR DEVICE

CROSS-REFERENCE TO RELATED APPLICATIONS

This application is a continuation of application Ser. No. 09/417,466, filed on Oct. 12, 1999 now U.S. Pat. No. 6,140,697 which is a continuation of application Ser. No. 08/930,083, filed on Feb. 9, 1998 (now U.S. Pat. No. 5,986,341), which is a 317 of PCT/JP96/01264 May 14, 1996 the entire disclosures of which are hereby incorporated by reference.

FIELD OF THE INVENTION

The present invention relates to a semiconductor device; more specifically, the present invention relates to a semiconductor device particularly preferable for use in extremely thin, inexpensive IC cards with high bending toughness, wireless multi-chip modules and mobile communication terminals.

BACKGROUND ART

As to IC cards, a card with the cross structure shown in FIG. 20 is described in "Data Carrier, II", page 137 to 194, Japan Industrial Press Corporation, issued Mar. 15, 1991.

In the card, as apparently shown in FIG. 20, thick condenser chip 411 mounted on board 410 is connected through bonding wire 416 to printed wiring board 412 and is then molded with resin 415, and the resulting whole structure is incorporated into center core 413, of which the top and bottom are covered with over-sheet 409, 414.

Furthermore, Japanese Patent Laid-open No. Hei 3-87299 proposes an IC card comprising a thin-thickness chip.

In the card of such conventional type having the structure shown in FIG. 20, elements such as condenser chip 411 are so thick that these elements are weak to stress of bending and are therefore readily broken, disadvantageously.

As to the card proposed by the Japanese Patent Laid-open No. Hei 3-87299, as shown in FIG. 8, the surface and back face of the condenser chip 41 bonded to the thick board 42 are stressed by a stretch or press operation if the board is bent, so that larger stress is applied to the condenser chip 41 (of a thickness of 200 $\mu$m). Therefore, the connection between metallized pattern 43 and the condenser chip 41 connected to the pattern 43 fails; or the condenser chip 41 weak to mechanical stress because of the thin-thickness is readily broken through the stress. Hence, the reliability thereof is particularly low.

A card of such conventional structure using condenser chip 41 is fabricated by attaching condenser chip 41 onto thin card 42 readily bendable, followed by wire bonding, and therefore, the card is at low reliability because condenser chip 41 is readily broken. Additionally, the number of the process steps for mounting is so large. Accordingly, it has been difficult to reduce the production cost.

DISCLOSURE OF THE INVENTION

It is an object of the present invention to overcome the problems of the prior art and provide a highly reliable, inexpensive semiconductor device strong to bending, particularly a semiconductor device of a thin-thickness type, having functions as IC card, multi-chip module or mobile communication terminal.

So as to attain the object, in accordance with the present invention, a thin-thickness device or integrated circuit comprising a condenser is mounted on a flexible card board of the same size as that of a card, and the thickness of the condenser, an integrated circuit or a coil and the thickness of the card provided with the condenser, the integrated circuit or the coil are individually fixed at given dimensions.

More specifically, the thickness of the integrated circuit, the condenser or the coil is defined as 110 $\mu$m or less, provided that the lower limits of the thickness of the card and the condenser are 50 $\mu$m and 0.1 $\mu$m, respectively.

By fixing the integrated circuit, the condenser or the coil at such thin thickness, the integrated circuit, the condenser or the coil gets strong to stress of bending. When these are connected to a thin board such as IC card with a flexible adhesive, a highly reliable IC card strong to stress of bending can be produced.

Preferably, the thickness of a semiconductor device, namely the card on completion, is 760 $\mu$m or less when the thickness of the integrated circuit, the condenser or the coil is 110 $\mu$m or less.

Preferably, the thickness of a semiconductor device, namely the card on completion, is 500 $\mu$m or less, when the thickness of the integrated circuit, the condenser or the coil is 19 $\mu$m or less. Additionally, the thickness of a semiconductor device, namely the card on completion, is 250 $\mu$m or less, when the thickness of the integrated circuit, the condenser or the coil is 4 $\mu$m or less.

Because the thin-thickness condenser attached on the card is thin, the board and the condenser are now possibly wired by means of a conductive paste. Accordingly, compared with conventional wire bonding by means of gold wire, a flat IC card of thin thickness can be produced at a low material cost and at a large scale.

The structure comprising such a thin-thickness condenser can be applied to the fabrication of not only IC card but also other devices of similar shapes and multi-chip mounting.

On the cross section of the card bent, stretch forces are induced on the surface of the curved board, while shrink forces are induced on the back face. Because no shrinkage occurs then at the central part of the cross section of the card under less stress, the stress to be loaded onto a thin-thickness condenser chip can be released, if the condenser chip is placed on the part.

It is needless to say that the condenser chip of a thin thickness is better. Extremely preferable outcome can be gained if the thickness is 110 $\mu$m or less. If the card is thick, however, the stiffness of the card enlarges the critical curvature ratio. Hence, the card is scarcely bent. Thus, the condenser chip may satisfactorily be thick at some extent.

If the card is of a thin thickness, on contrast, the card is readily bent. So as to release the stress of the condenser chip, the condenser chip should be thin. For preparing a condenser of a thin thickness, a thinner thickness of the condenser requires more precise apparatuses for fabricating such condenser. Thus, as to how thin the condenser should be fabricated, it should be assessed from both the standpoints of economical efficiency and procurement of reliability.

A given correlation in thickness between the card and the condenser chip is present; by fixing both the card and the condenser chip at the aforementioned thickness, various cards strong to bending and highly reliable can be produced at a low cost. It is needless to say that this is the case with the thickness of the coil and the integrated circuit placed internally in the card, other than the thickness of the condenser.

The lowest thickness limits of the semiconductor device, namely the card on completion, and the condenser, are 50

μm and 0.1 μm, respectively. If the card thickness is smaller than 50 μm, the flexibility of the card is distinctively reduced which causes difficulty in putting the card for practical use; and it is also difficult to fabricate a condenser of a thickness of 0.1 μm.

BEST MODE FOR CARRYING OUT THE INVENTION

Example 1

Figure 1:
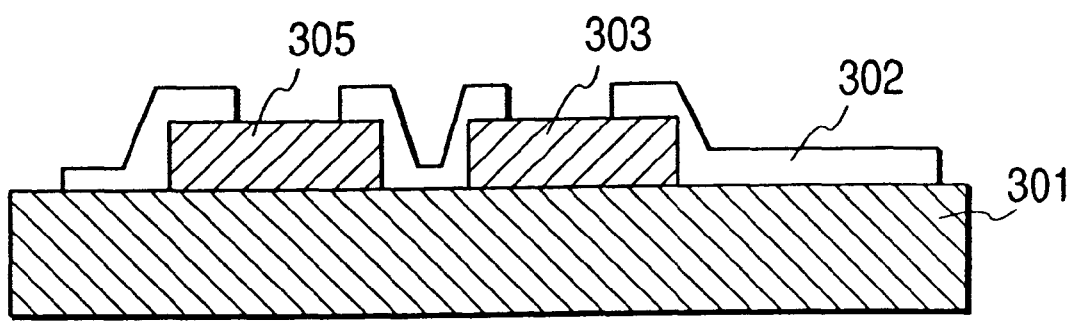
FIG. 1 is a cross sectional view explaining Example 1 of the present invention.

FIG. 1 is a cross sectional view explaining Example 1 of the present invention;

As shown in FIG. 1, thin-thickness condenser 303 and coil 305 are bonded onto the surface of card board 301 with conductive material film 302 (Trade name; Anisolm, manufactured by Hitachi Chemicals, Co.).

Because the thickness of the thin-thickness condenser 303 is as thin as about 1 to 10 μm, the condenser 303 can readily be bonded to the surface of the board 301 by using the conductive material film 301 in paste or ink-like liquid because the difference in level between the surface of the board 301 and the condenser 303 bonded to the board 301 is so small.

Therefore, the optimum card shape can be formed owing to such flat connection at an extremely low height. The conductive material film 302 in paste is as thin as about 10 μm, with higher flexibility, so the film is characteristically strong to bending and resistant to difference in thermal expansion coefficient.

The thin-thickness condenser chip 303 was formed as follows.

Figure 2:
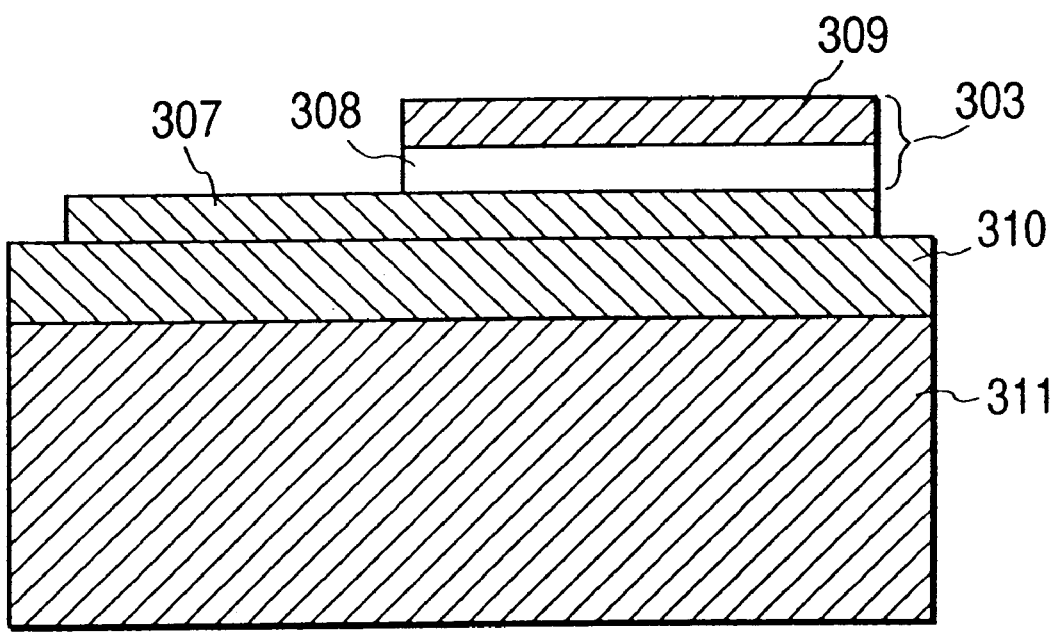
FIG. 2 is a cross sectional view explaining the Example 1 of the present invention.

As shown in FIG. 2, firstly, lamination film 310 comprising an oxide film and a single crystal silicone film was formed on silicone board 311, to fabricate SOI (silicone on insulator) wafer.

Figure 3:
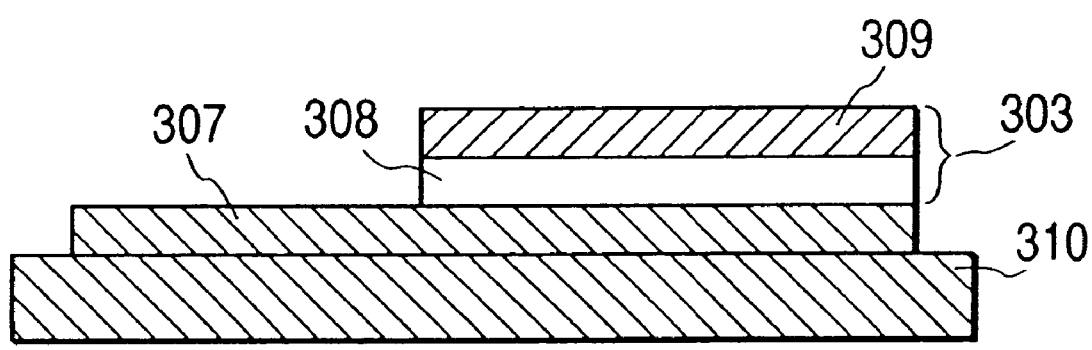
FIG. 3 is a cross sectional view explaining the Example 1 of the present invention.

As shown in FIG. 3, then, condenser 303 comprising lower electrode 307, isolation film 308 and upper electrode 309 was fabricated on the main surface side of the SOI wafer by a well-known semiconductive process. As the lower electrode 307, use was made of thermally resistant titanium and platinum; as the isolation film 308, use was made of a film comprising a material with a larger dielectric constant, such as PZT (solid solution of lead zirconia and lead titanate).

Subsequently, selective etching by means of an aqueous 40% KOH (potassium hydroxide) solution was done to remove the silicone board 311, to subsequently fabricate the structure shown in FIG. 3. Because the oxide film formed on the silicone board 311 then functioned as a stopper of etching, the lamination film 310 comprising the silicone film and the oxide film could be left while the silicone board 311 was selectively removed. Consequently, the condenser 303 comprising the electrode 307, the isolation film 308 and the electrode 309 was formed on the thin lamination film 310, structurally.

Figure 4:
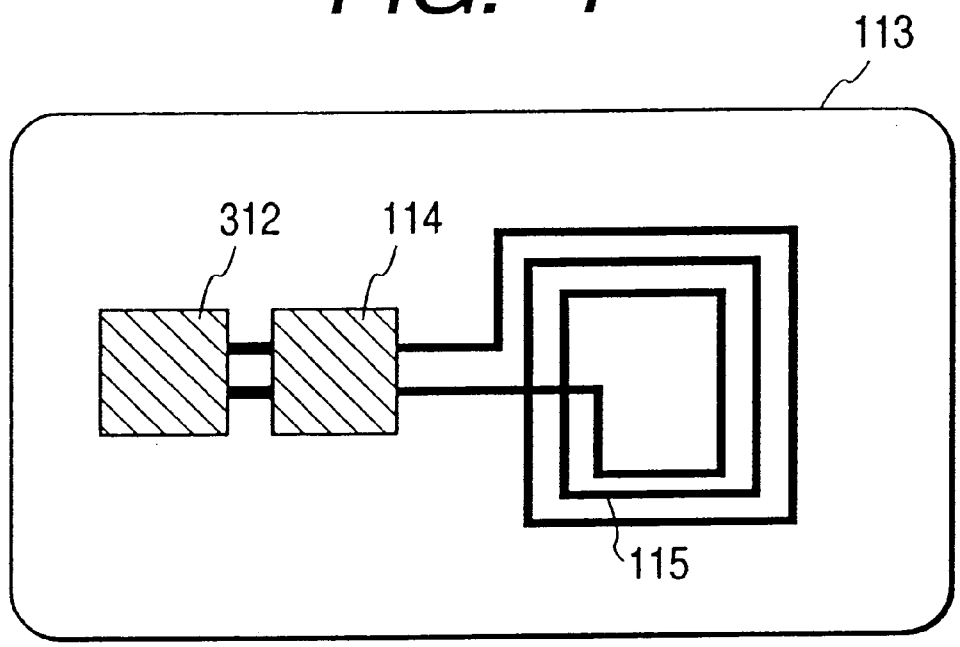
FIG. 4 is a plane view explaining the Example 1 of the present invention.

By fabricating thin-thickness integrated circuit 312 and printed coil 115 as a conductive pattern by a well-known process, card 113 of the plane structure shown in FIG. 4 was formed. As the conductive pattern, coil 115 formed by printing process was used in the present Example, but a coil formed by processes other than printing process may also be used satisfactorily.

The coil 115 generates a dielectric electromotive force on receiving electromagnetic wave from outside, to supply energy to thin-thickness condenser 114. The coil 115 and the thin-thickness condenser 114 adhered highly in packing density to the integrated circuit 310 with a conductive paste or an anisotropic conductive adhesive, so that the coil 115 and the thin-thickness condenser 114 are electrically connected together. The coil 115 also functions to transmit information data supplied from the outside of card 113 to the thin-thickness condenser 114 and to transform the data from the thin-thickness condenser 114 in electromagnetic wave and transfer the wave outside the card 112. A communication card, contactless and highly reliable, can be produced by forming the card 112 of such a structure.

Because electrodes are placed on the surface of cards called as contact type among conventional cards, contact-miss failure occurs or the cards are weak to electrostatic force, disadvantageously. The present invention may satisfactorily be applicable to conventional contact-type cards.

Figure 5:
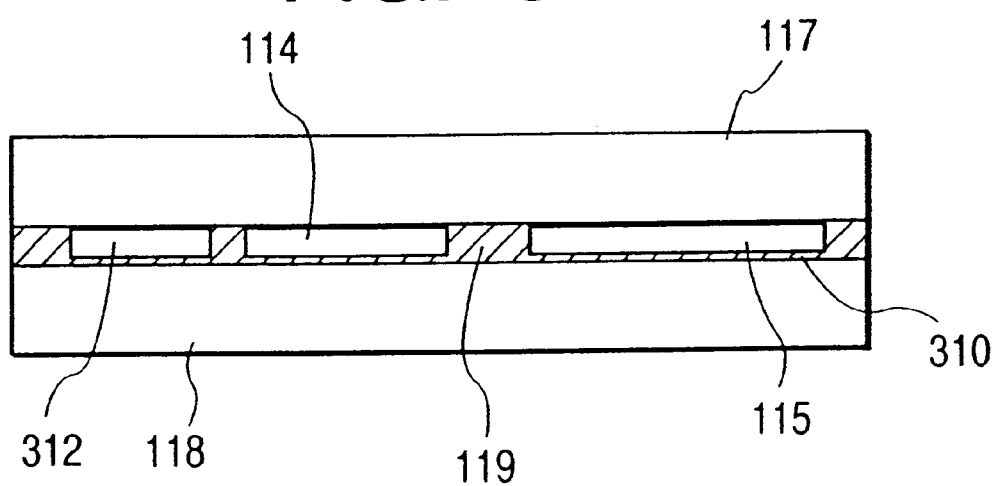
FIG. 5 is a cross sectional view explaining the Example 1 of the present invention.

Then, flexible adhesive 119 for example silicone was filled into the space formed by the thin-thickness condenser 114, the integrated circuit 312 and the coil 115 fabricated by printing process; additionally, the upper cover sheet 117 and the lower cover sheet 118 were fixed with the adhesive 119, to form a card of the cross structure shown in FIG. 5.

The adhesive 119 had double operation of adhesion and filling up; and the thin-film condenser 114 and the like were enclosed and retained within the soft gummous material, so any stress was hardly loaded onto the surface of the condenser 114 and the like; and additionally, the resulting card was strong to bending.

Even if the card deforms when the card is attacked by shock pin-point force, the force from outside is released through the adhesive layer 119, which prevents stress attack on the surface of the condenser 114.

Example 2

In the present Example, an extremely thin-thickness condenser was placed on the neutral surface of cards. By putting the condenser between the two cards, a practically satisfactory bending toughness was procured in this Example.

Figure 6:
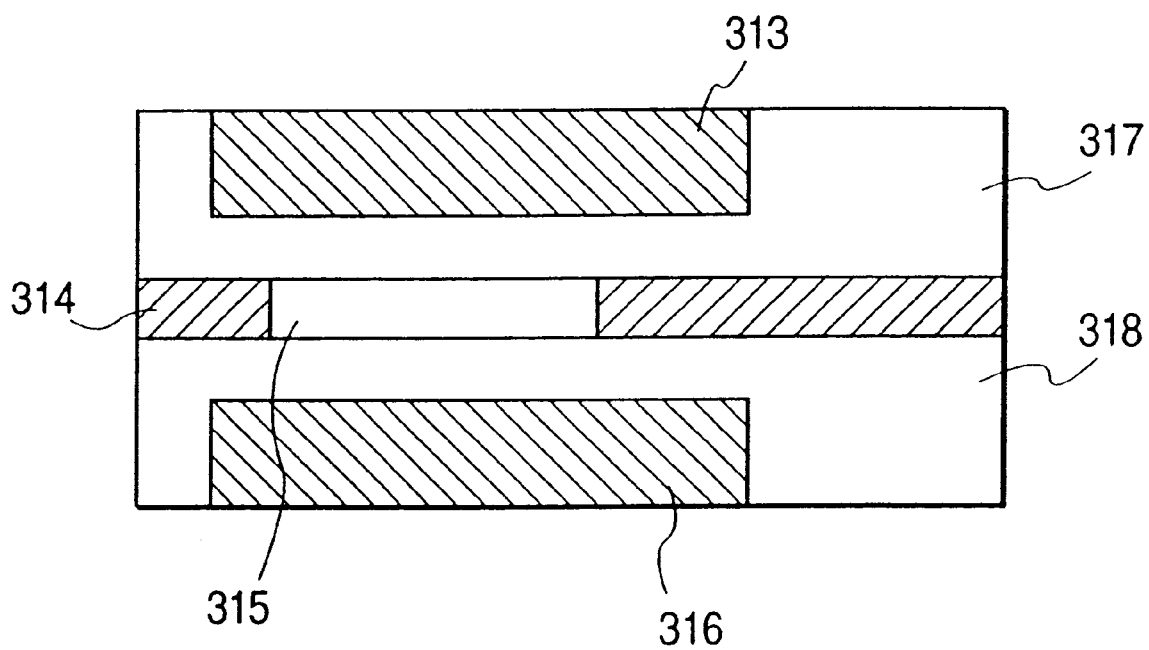
FIG. 6 is a cross sectional view explaining Example 2 of the present invention.

As apparently shown in FIG. 6, in the present Example, thin-thickness element 315 for example condenser chip and coil is fixed between the upper card board 317 and the lower card board 318 by means of adhesive 314, and by individually arranging thin plates 313, 316 comprising a harder material than these card boards 317, 318 on these card boards, the element was reinforced.

The thin-thickness element 315 is at a thickness of 1 to 110 $\mu$m, which is far thinner than the thickness of conventional elements, and therefore, by arranging the thin-thickness element 315 on the neutral surface, the element was reinforced by the thin plates 313, 316, whereby satisfactory bending toughness was procured and the card surface could be prepared as flat.

Example 3

Figure 7:
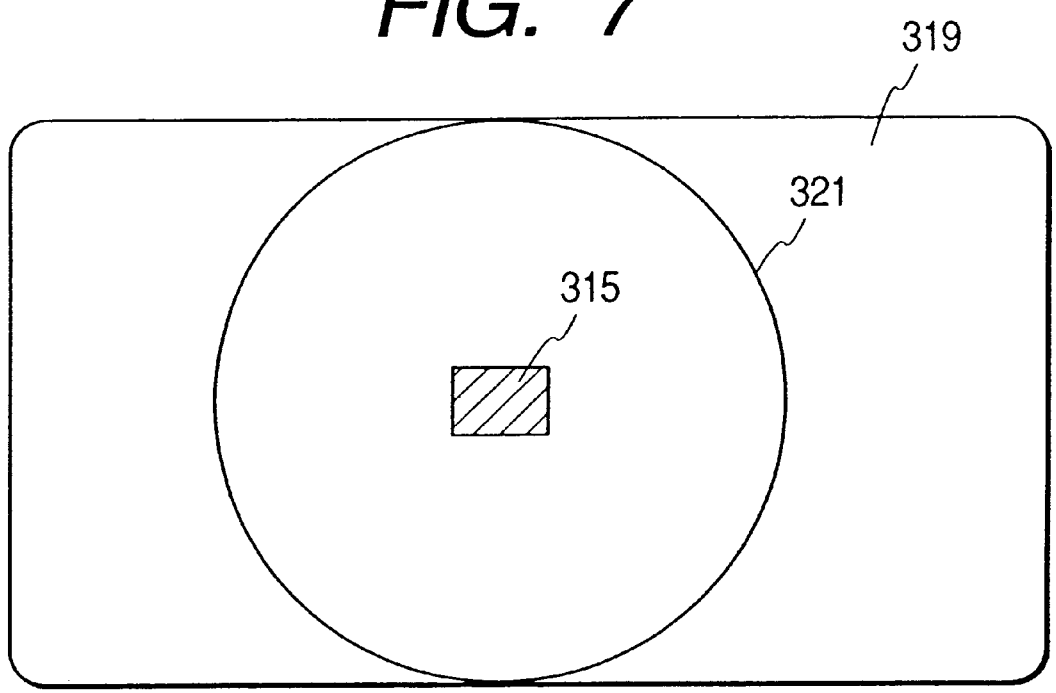
FIG. 7 is a plane view explaining Example 3 of the present invention.
Figure 8:
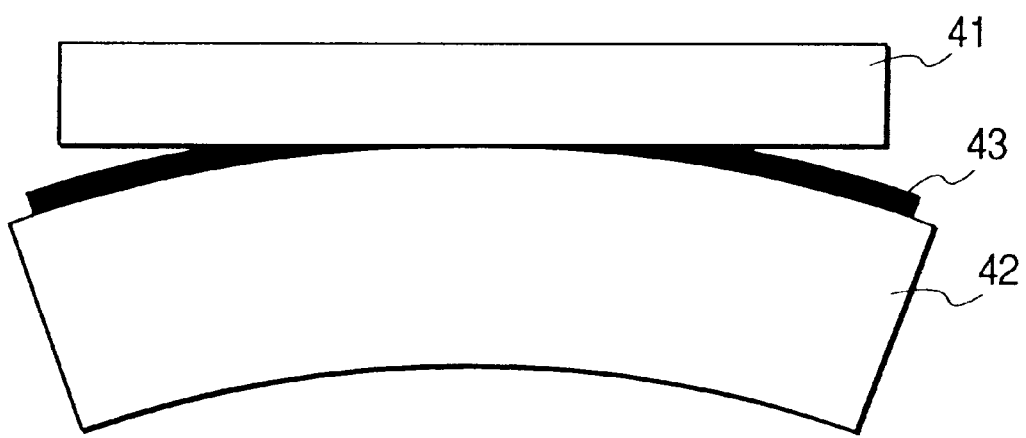
FIG. 8 is a cross sectional view explaining the problems of conventional cards.

Using FIG. 7 depicting plane placement, another example of the present invention to produce a card with better bending toughness than conventional ones will be explained.

As apparently shown in FIG. 7, in the present Example, thin-thickness element 315 for example condenser chip and coil is placed inside circle 321 with the diameter equal to the short side's length of card 319 and with the center thereof placed at the center of the card. It was observed that the immunity to bending was thereby improved, and it was found that the resulting card could be used in a far more simple manner than conventional ones.

Figure 9:
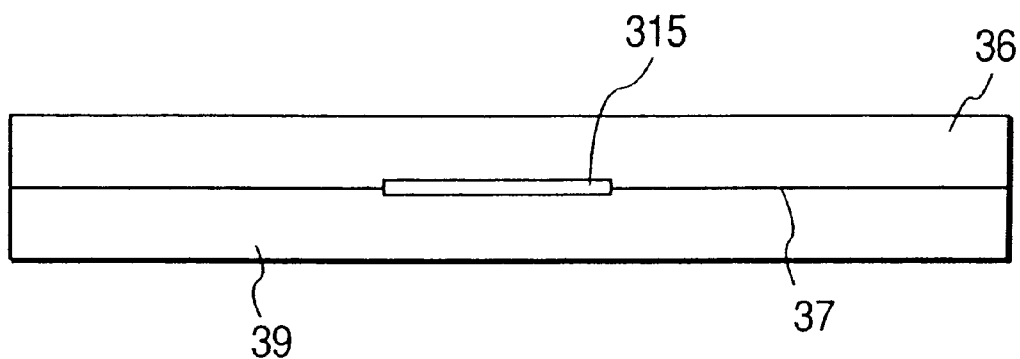
FIG. 9 is a cross sectional view explaining the Example 3 of the present invention.

FIG. 9 depicts an example wherein a thin-thickness condenser was used as the thin-thickness element 315 and the thin-thickness condenser 315 was embedded at the center position 37 of card board 36.

When the card board 36 was bent, the surface and back face thereof were both stressed by a stretch or press operation. Because the thin-thickness condenser 315 was placed at the center position 37 of the card board 36, the thin-thickness condenser 315 was never attacked by such stress. Thus, a highly reliable card strong to bending was produced.

Figure 10:
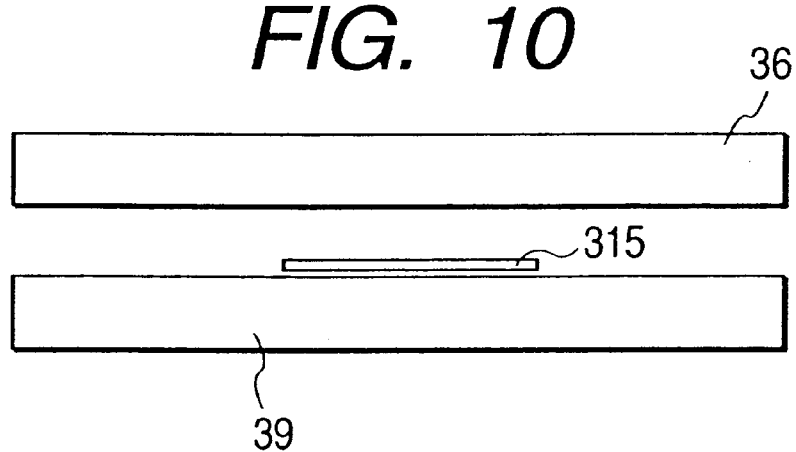
FIG. 10 is a cross sectional view explaining the Example 3 of the present invention.

So as to form a card of the structure shown in FIG. 9, firstly, thin-thickness condenser 315 is attached on the surface of card board 39, as shown in FIG. 10. Then, second card board 36 of the same thickness as that of the card board 39 is attached onto the thin-thickness condenser 315, whereby the structure shown in FIG. 9 can be formed readily. It is needless to say that the thin-thickness condenser 315 may be placed at a desirable position inside the circle 321 shown in FIG. 7, in addition to the center position of the board 39.

Example 4

Figure 11:
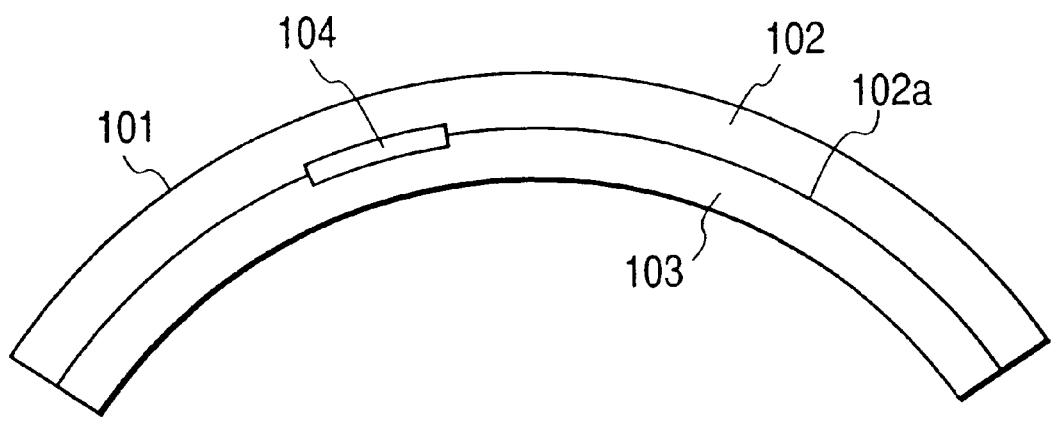
FIG. 11 is a cross sectional view explaining Example 4 of the present invention.

FIG. 11 is a view explaining another example of the present invention, depicting the state of a card with a curvature due to bending stress.

Because thin-thickness condenser chip 104 is put between lower card board 103 and upper card board 101 along the center line 102a of the cross sections of the two boards, such structure is the last to be influenced by bending. Thus, the thin-thickness condenser chip 104 is not stressed. When the card is bent, the thin-thickness condenser chip 104 is also bent, but the stress then is extremely small because the thin-thickness condenser chip 104 is extremely thin.

Figure 12:
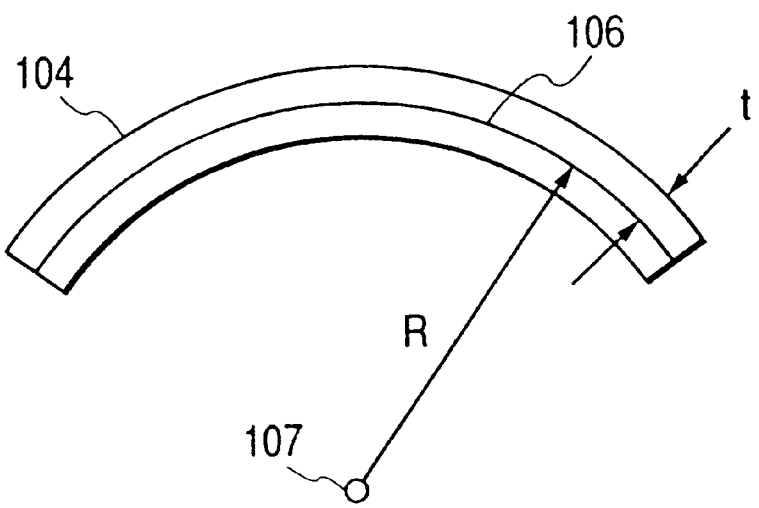
FIG. 12 is a cross sectional view explaining the Example 4 of the present invention.

FIG. 12 shows the case that condenser chip 104 is bent. When the condenser chip 104 is bent, the surface stress $\rho$ of the condenser chip 104 is represented, as follows, according to Navier's theorem; $\rho = E \times t/R$. As shown in FIG. 12, herein, E represents Young's modulus of the condenser; R represents radius of curvature; and t represents ½ of the thickness of the condenser chip 104.

Because the surface of the condenser chip 104 comprises silicone oxide, E is equivalently equal to the Young's modulus of the silicone oxide. The above formula indicates that the surface stress of the condenser chip 104 is in proportion to the thickness of the condenser chip 104 but in reverse proportion to the radius of curvature R. When the surface stress of the condenser chip 104 is larger than the mechanical toughness of the condenser chip 104, the chip is broken through bending. Because the radius of curvature R is infinite in the absence of any bending, the surface stress $\rho$ is zero; when R gets smaller following the progress of bending, the stress $\rho$ gets larger, until the condenser chip 104 is broken finally.

However, if the condenser chip 104 is thin, the surface stress $\rho$ is reduced, even through bending with the same radius of curvature R, and therefore, the condenser chip 104 can get sufficiently strong to bending if the condenser chip 104 is made thinner within a range not exceeding the limit against mechanical break.

If the condenser chip 104 is made so thin, however, the chip is difficult to be handled. As shown in FIG. 11, thus, the thin-thickness condenser 104 is put between two card boards 102, 103 comprising plastics, metal and the like, whereby the condenser is readily handled, involving the increase of the toughness. Then, most preferably, the thin-thickness condenser chip 104 is placed on neutral surface 102a of card 101. By such placement, the neutral surface of the thin-thickness condenser 104 agrees with the neutral surface 102a of the card 101 with zero stress even when the card is bent, so that the thin-thickness condenser chip 104 is possibly never broken even if the card 101 is bent, as in the case that only the thin-thickness condenser chip 104 is singly bent.

Figure 13:
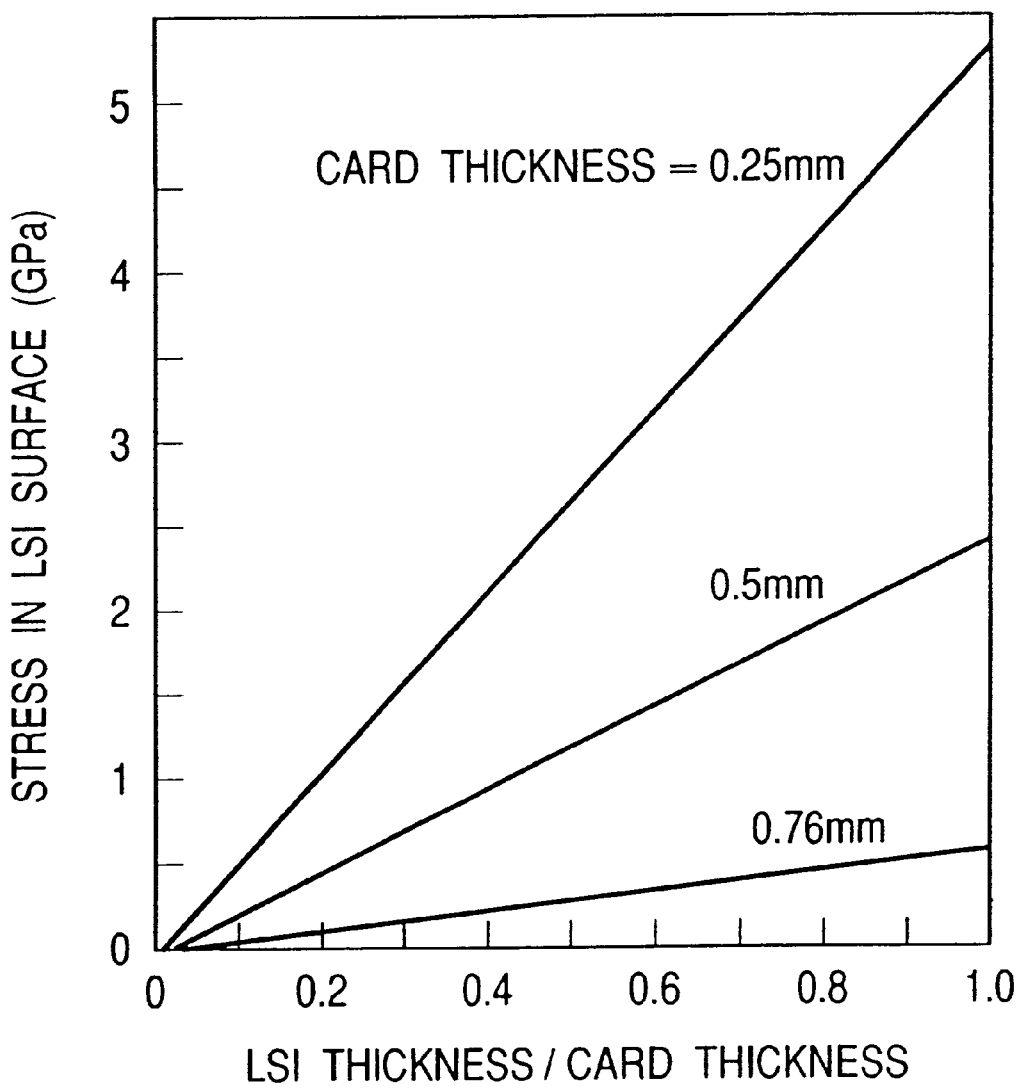
FIG. 13 is an explanatory view of the Example 4 of the present invention.

FIG. 13 shows the results of the determination of the dependency of the surface stress of LSI on the ratio of the LSI thickness to the card thickness, using as the parameter the card thickness. After placing the thin-thickness condenser on the neutral surface of the card board, the surface stress of the thin-thickness condenser was determined, correspondingly to the ratio of the thickness of the thin-thickness condenser to the card thickness.

The LSI surface stress has a significant relation with the degree of the curvature of the card; the degree of the curvature of the card varies largely, depending on the thickness and materials of the card, and the force loaded onto the card, and the position of the card. In the present Example, an LSI chip was placed at the center position of the plane face of the card; as the card material, vinyl chloride commonly used for general magnetic cards and credit cards was used. Because PET material is characteristically harder and is more scarcely bent than vinyl chloride, the results recovered by using vinyl chloride are applicable to any card comprising other materials including PET.

The radius of curvature defining the degree of bending varies depending on the bending moment loaded on the card. The bending moment was loaded onto the card, up to a limit above which the card is bent and folded over. The radius of curvature at the center of a vinyl chloride card of a thickness of 0.76 mm was 50 mm. Provided that the thickness of the LSI chip is the same as the thickness of the card, herein, the surface stress of the LSI chip is calculated by the formula 8E12×0.38/50 (Pa), according to the aforementioned formula of stress, which is 600 MPa. The Young's modulus of glass cited from the Japanese Scientific Table was used. Because the surface of the LSI chip is principally composed of silicone oxide film layer, it is assumed that the surface has the same physical properties as those of glass.

Figure 15:
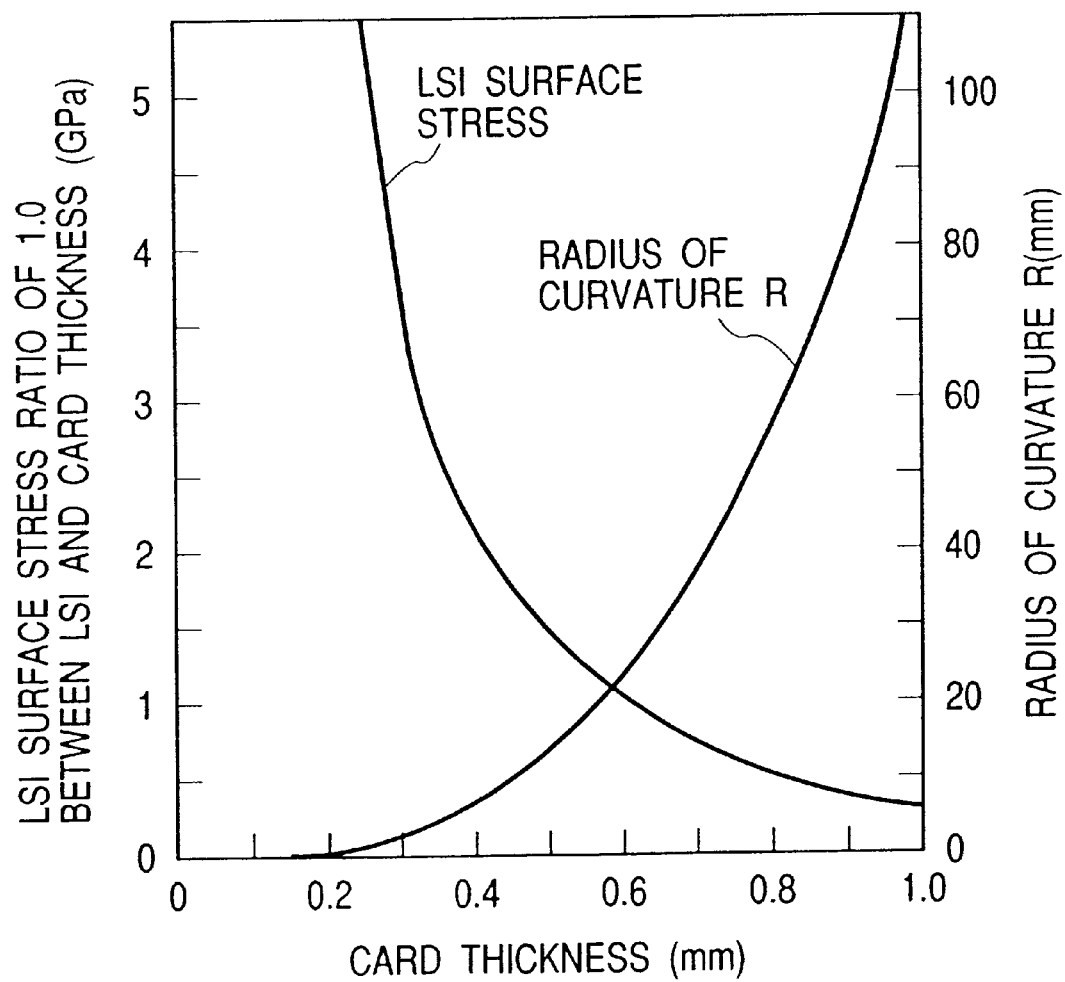
FIG. 15 is an explanatory view of the Example 4 of the present invention.

The moment of inertia of the card is involved in the relation between the radius of curvature and the thickness of the card. The radius of curvature R is represented by E×I/M, wherein E represents the Young's modulus of the card; I represents the moment of inertia; and M represents bending moment. Because the moment of inertia of the card is in proportion to the cube of the thickness of the card, the profile curve of the radius of curvature, as shown in FIG. 15, is prepared. FIG. 15 shows that the surface stress of the LSI chip is 2.5 GPa and 5.4 GPa at card thickness of 0.5 mm and 0.25 mm, respectively, provided that the ratio of the thickness of the LSI chip to the card thickness is 1.0. At that state, the LSI chip is readily broken, but in accordance with the present invention, the LSI chip fabricated thin is put between the neutral surfaces of the cards. Therefore, such break can be prevented.

Using the ratio of the thickness of the LSI chip to the card thickness as a parameter, the surface stress of the resulting condenser of thin thickness was measured. The results are shown in FIG. 13. An enlarged view of a part of FIG. 13 is shown in FIG. 14, wherein the ratio of the thickness of the LSI chip to the card thickness is 0 to 0.16.

Figure 14:
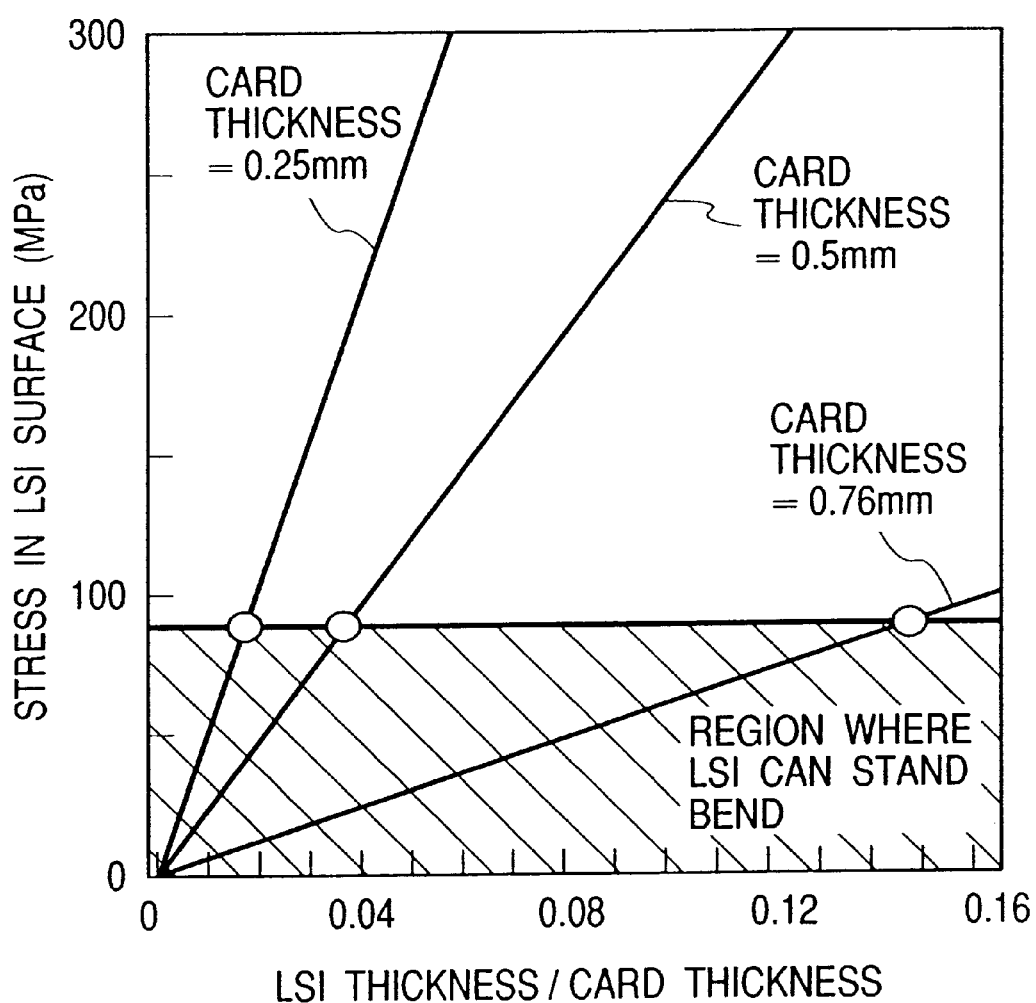
FIG. 14 is an explanatory view of the Example 4 of the present invention.

In FIG. 14, the stress of the LSI chip durable of bending is 90 MPa, and the value is cited from the Japanese Scientific Table, provided that the break strength of the LSI chip is assumed to be equal to the break strength of glass. Thus, the necessary thickness of the LSI chip and the lowest thickness limit of the LSI chip at various dimensions of card thickness can be determined in FIG. 14. More specifically, any break of the LSI chip due to card bending absolutely never occurs, provided that the thickness of the LSI chip is 110 $\mu$m or less at the card thickness of 0.76 mm; that the thickness of the LSI chip is 19 $\mu$m or less at the card thickness of 0.5 mm; and that the thickness of the LSI chip is 4 $\mu$m or less at the card thickness of 0.25 mm.

It is needless to say that the reliability of the LSI chip is so much improved when the thickness of the LSI chip is as thin as the lowest limit, but the limit of the thickness of the chip to be possibly fabricated is almost 0.1 $\mu$m. The fabrication of any LSI chip thinner than the limit is difficult.

The LSI chip and the thin-thickness condenser are most preferably placed in such a manner that the neutral surfaces of the LSI chip and the thin-thickness condenser might agree with the neutral surface of the card. However, the upper or lower faces of the LSI chip and the thin-thickness condenser are satisfactorily placed within the upper or lower faces of an LSI chip and a thin-thickness condenser being individually of the lowest thickness limits defined by the card thickness and being placed on the neutral surface of the card.

More specifically, the upper or lower face of the thin-thickness integrated circuit, the thin-thickness condenser or the coil is satisfactorily positioned within 55 $\mu$m above or below the neutral surface of the card provided that the thickness of the card on completion is 760 $\mu$m or less, or within 9.5 $\mu$m above or below the neutral surface of the card provided that the thickness of the card on completion is 500 $\mu$m or less, or within 2 $\mu$m above or below the neutral surface of the card provided that the thickness of the card on completion is 250 $\mu$m or less.

Example 5

Figure 16:
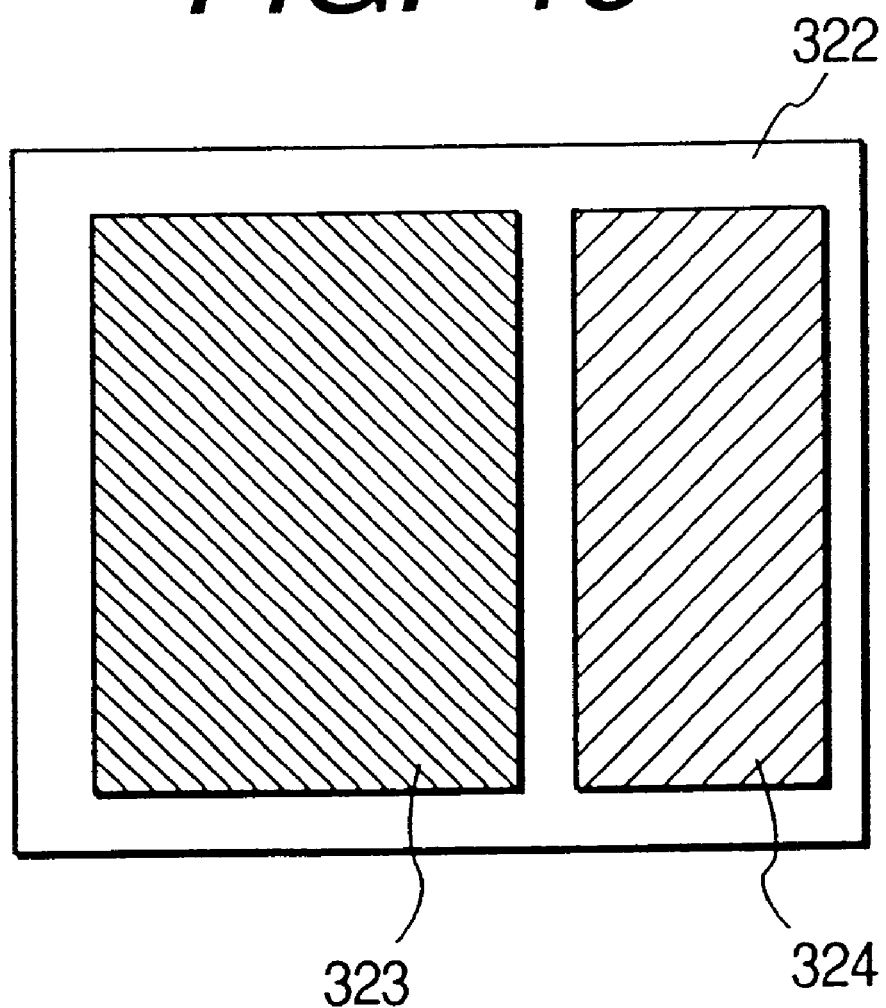
FIG. 16 is a plane view explaining Example 5 of the present invention.

FIG. 16 shows another example of the present invention.

Thin-thickness condenser may possibly be provided with various control functions. More specifically, as described above, SOI wafer and the well-known semiconductive process are used to fabricate circuit device part 323 and condenser part 324 in an adjacent fashion to each other, in thin-thickness condenser 322, whereby various controls can be included in one chip and high performance and low cost can be established. For example, the circuit device part 323 can be utilized for data storage in wireless cards.

Example 6

Figure 17:
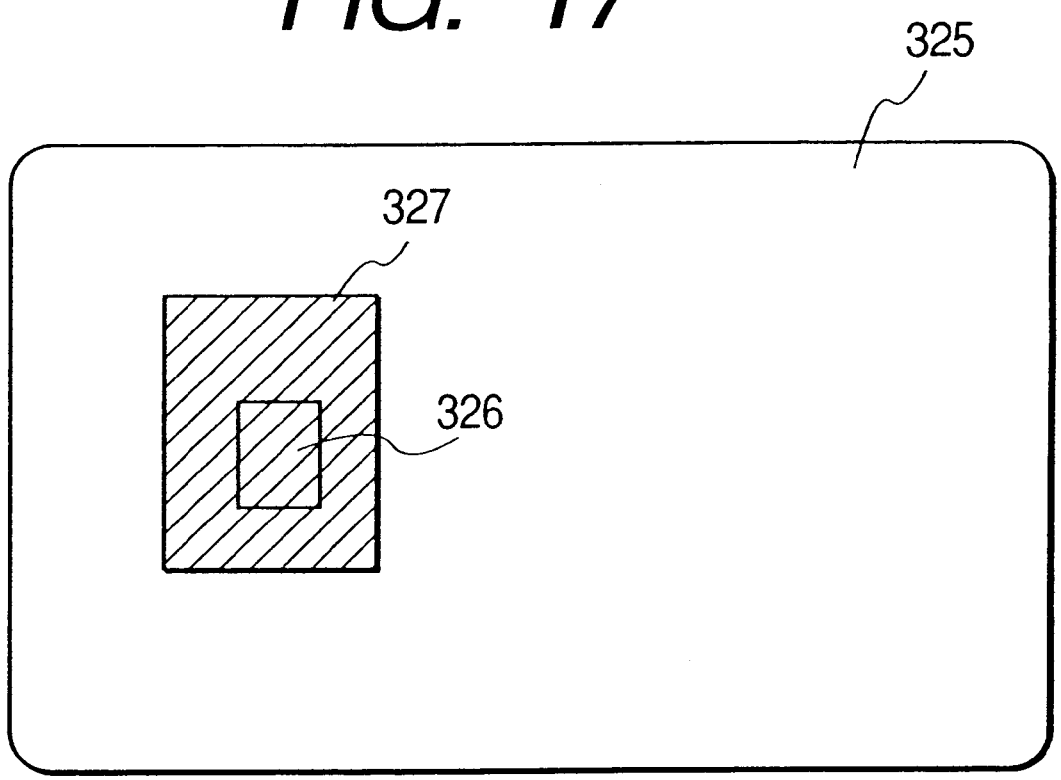
FIG. 17 is a plane view explaining Example 6 of the present invention.

FIG. 17 depicts another example of the present invention. In accordance with the present invention, thin-thickness elements such as condenser chip are put between two card boards to fabricate a card, and therefore, the card surface is very flat. A card comprising conventional thick elements is weak to bending, on the surface of which difference in level up to 150 $\mu$m may be formed, so that it is difficult to make the card flat until the difference is reduced to 30 $\mu$m, which is essential for pressure-sensitive printing process. So as to make the surface flat, the structure should be so highly precise that the cost therefor is eventually escalated.

In accordance with the present invention, however, various elements such as condenser chip are extremely thin and the surface is flat, as described above. As shown in FIG. 17, therefore, thin-thickness element 326 can be placed below picture 327, in the present Example, whereby the degree of freedom is improved.

Example 7

Figure 18:
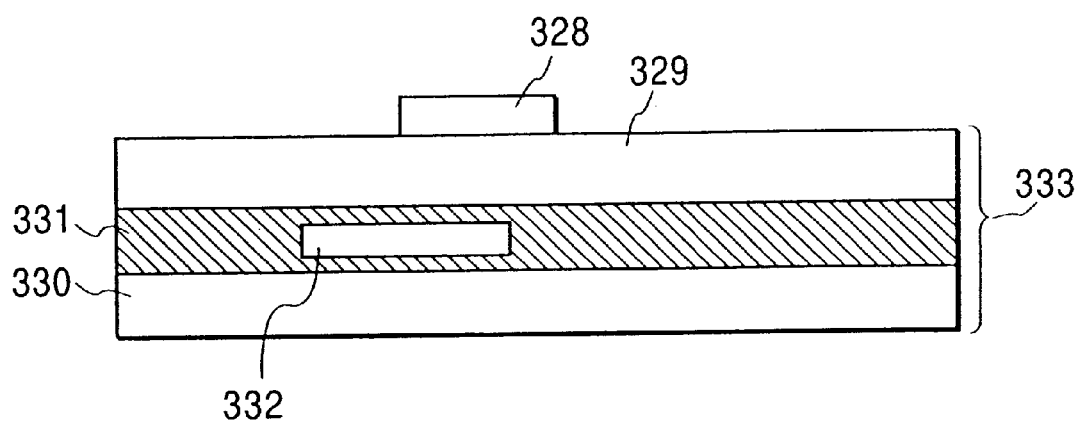
FIG. 18 is a cross sectional view explaining Example 7 of the present invention.

FIG. 18 shows the cross structure of a card, on the surface of which printing is effected; printing material 328 is placed so that the material might be hung or held over thin-thickness element 332. In the structure, the thin-thickness element 332 is so thin and embedded in adhesive 331, and the upper cover sheet 329 and lower cover sheet 330 are bonded together with the adhesive 331. Thus, the surface turns flat.

Therefore, even when a printing roll reaches the top of the edge of the thin-thickness element 332, the pressure is dispersed, with no occurrence of break of the thin-thickness element 332. Those to be printed on the surface of the upper cover sheet 329 or lower cover sheet 330 include for example a photograph of the face of a card holder. In this case, the part of the photograph is handled gently, so the thin-thickness element 332 can be placed at a desirable position, taking account of the use.

Figure 19:
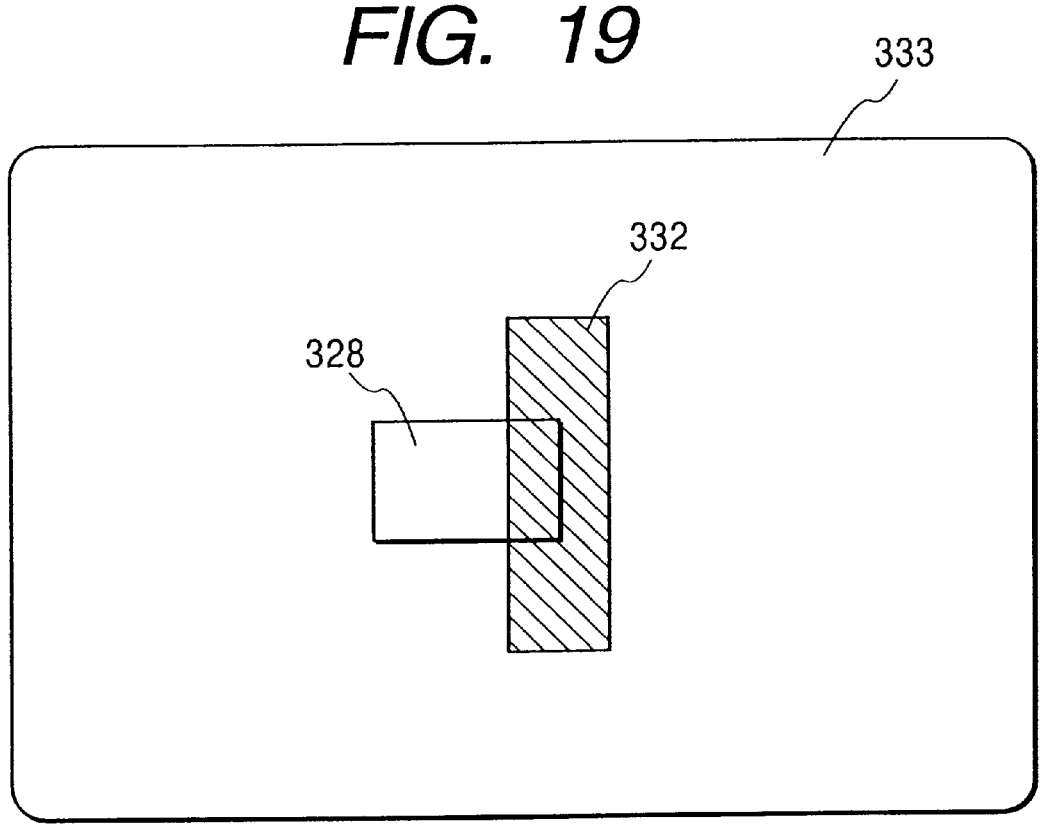
FIG. 19 is a plane view explaining the Example 7 of the present invention.
Figure 20:
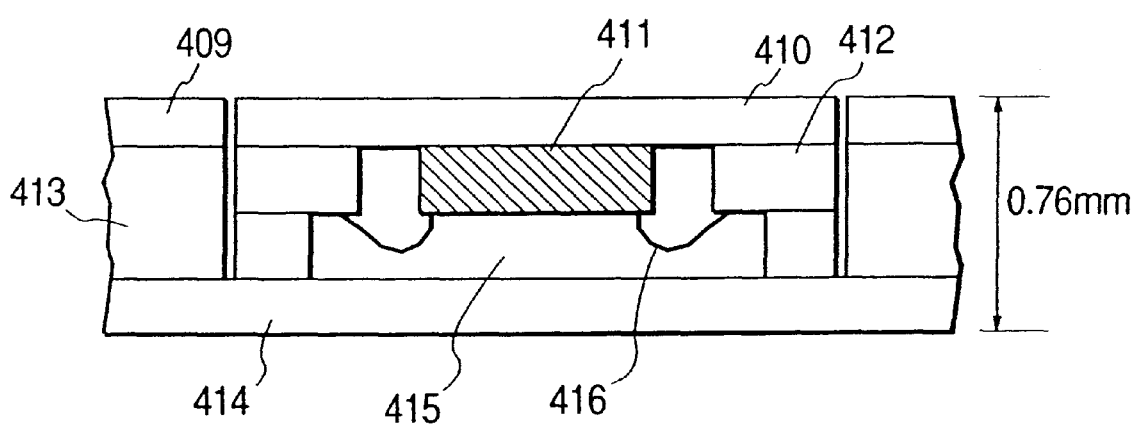
FIG. 20 is a cross sectional view depicting one example of conventional cards.
Figure 21:
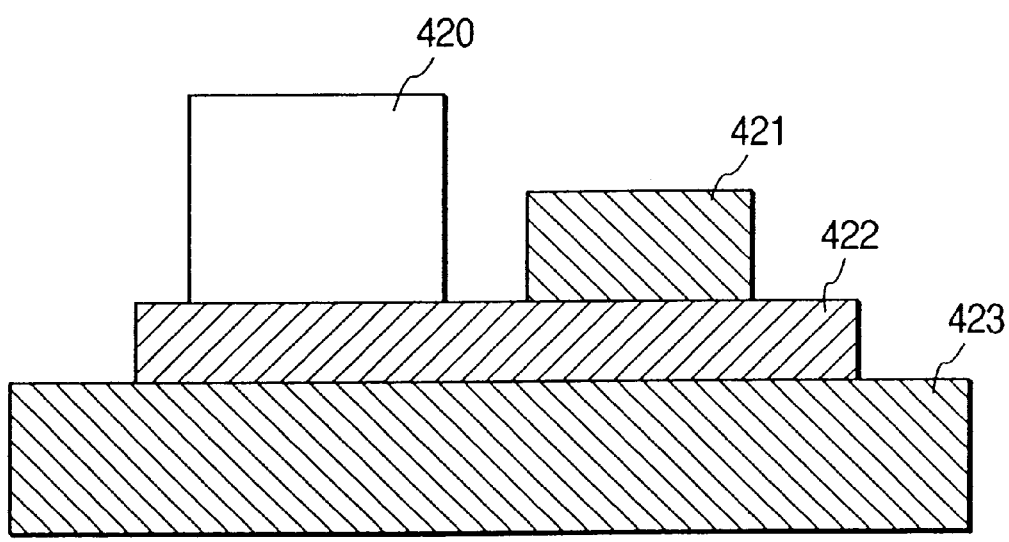
FIG. 21 is a cross sectional view depicting one example of conventional cards.

FIG. 19 is a view depicting the plane structure of the card shown in FIG. 18, wherein printing material 332 effects predetermined printing over the thin-thickness element 332 placed on the card 333. Conventionally, the thin-thickness element 332 has been broken frequently in such structure. In the present Example, however, the thin-thickness element 332 is so extremely thin as described above that predetermined printing could be effected with no concern of break. A card of not a complex structure but a simple structure at high reliability could be produced.

As apparent in the description above, the following advantages can be brought about in accordance with the present invention.

1. High reliability because of no concern of break due to bending.

2. Ready production at low cost because of the simple structure.

3. Because the condenser is extremely thin, the board and the condenser can be wired with a conductive paste, with the resulting lower cost and additionally with the resulting flat surface.

4. An extremely thin-thickness condenser can be produced by the use of SOI wafer, with lesser concern against break due to bending.

We claim:

1. A card-shaped semiconductor device comprising:
    a condenser chip having a thickness not greater than 110 $\mu$m and including a circuit element portion and a condenser portion;
    a coil having a thickness of 110 $\mu$m or less and providing energy to said condenser portion; and
    first and second flexible substrates interposing said condenser chip and coil between them,
    wherein said first and second flexible substrates are bonded together with adhesive,
    wherein a neutral plane of said card-shaped semiconductor device is positioned between upper and lower surfaces of said condenser chip.

2. A card-shaped semiconductor device according to claim 1,
    wherein said condenser chip is strengthened by using a plate harder than said first and second substrates.

3. A card-shaped semiconductor device according to claim 1,
    wherein material of said first and second flexible substrates is a PET.

4. A card-shaped semiconductor device according to claim 1,
    wherein said card-shaped semiconductor device includes plural integrated circuit chips.

5. A card-shaped semiconductor device according to claim 1,
    wherein said condenser chip includes a titanium oxide film as a dielectric film of the condenser.

6. A card-shaped semiconductor device according to claim 1,
    wherein said condenser chip includes a titanium or platinum film as an electrode of the condenser.

7. A card-shaped semiconductor device according to claim 1,
    wherein said coil is printed.

8. A card-shaped semiconductor device comprising:
    a condenser chip having a thickness not greater than 110 $\mu$m and including a circuit element portion and a condenser portion;
    first and second flexible substrates interposing said condenser chip between them, and
    wherein said first and second flexible substrates are bonded together with adhesive,
    wherein said condenser chip is strengthened by using a thin plate harder than said first and second flexible substrate,
    wherein a neutral plane of said IC card is positioned between upper and lower surfaces of said condenser chip.

9. A card-shaped semiconductor device according to claim 8,
    wherein material of said first and second flexible substrates is PET.

10. A card-shaped semiconductor device according to claim 8,
    wherein said card-shaped semiconductor device includes plural integrated circuit chips.

11. A card-shaped semiconductor device according to claim 8,
    wherein said condenser chip includes a titanium oxide film as a dielectric film of the condenser.

12. A card-shaped semiconductor device according to claim 8,
    wherein said condenser chip includes a titanium or platinum film as an electrode of the condenser.

13. A card-shaped semiconductor device comprising:
    a condenser chip having a thickness not greater than 110 $\mu$m and including a circuit element portion and a condenser portion;
    first and second flexible substrates interposing said condenser chip between them, and
    wherein at least one of surfaces of said card-shaped semiconductor device is printed,
    wherein said first and second flexible substrates are bonded together with adhesive,
    wherein said condenser chip is disposed in said card-shaped semiconductor device such that a neutral plane of said card-shaped semiconductor device is positioned between upper and lower surfaces of said condenser chip.

14. A card-shaped semiconductor device according to claim 13,
    wherein said condenser chip is strengthened by using a plate harder than said first and second substrates.

15. A card-shaped semiconductor device according to claim 13,
    wherein material of said first and second flexible substrates is PET.

16. A card-shaped semiconductor device according to claim 13,
    wherein said card-shaped semiconductor device includes plural integrated circuit chips.

17. A card-shaped semiconductor device according to claim 13,
    wherein said condenser chip includes a titanium oxide film as a dielectric film of the condenser.

18. A card-shaped semiconductor device according to claim 13,
    wherein said condenser chip includes a titanium or platinum film as an electrode of the condenser.

* * * * *